(12) United States Patent
Nakao

(10) Patent No.: US 7,955,043 B2
(45) Date of Patent: Jun. 7, 2011

(54) SUBSTRATE TRANSFER APPARATUS

(75) Inventor: Hirotoshi Nakao, Chigasaki (JP)

(73) Assignee: Ulvac, Inc., Chigasaki-Shi, Kanagawa (JP)

( * ) Notice: Subject to any disclaimer, the term of this patent is extended or adjusted under 35 U.S.C. 154(b) by 259 days.

(21) Appl. No.: 12/301,794

(22) PCT Filed: May 28, 2007

(86) PCT No.: PCT/JP2007/060789
§ 371 (c)(1),
(2), (4) Date: Jan. 5, 2009

(87) PCT Pub. No.: WO2007/139052
PCT Pub. Date: Dec. 6, 2007

(65) Prior Publication Data
US 2010/0232921 A1    Sep. 16, 2010

(30) Foreign Application Priority Data

May 29, 2006  (JP) .................................. 2006-148259

(51) Int. Cl.
*B66C 23/00* (2006.01)
(52) U.S. Cl. ............... 414/744.5; 74/490.01; 74/490.04; 901/15; 901/21
(58) Field of Classification Search ............... 414/744.1, 414/744.5, 744.6; 901/15, 21, 29; 74/490.01, 74/490.04, 490.06
See application file for complete search history.

(56) References Cited

U.S. PATENT DOCUMENTS

| 6,910,847 | B1 * | 6/2005 | Blaufus et al. ............. 414/744.5 |
| 2004/0131461 | A1 * | 7/2004 | Momoki ..................... 414/744.5 |

FOREIGN PATENT DOCUMENTS

| JP | 10-296666 A | 11/1998 |
| JP | 2005-116665 A1 | 4/2005 |
| JP | 2006-123135 A | 5/2006 |

* cited by examiner

*Primary Examiner* — Donald Underwood
(74) *Attorney, Agent, or Firm* — Harness, Dickey & Pierce, P.L.C.

(57) ABSTRACT

Provided is a substrate transfer apparatus which can perform stable and highly accurate transfer without making a configuration complicated. A substrate transfer apparatus according to the present invention includes a multijoint arm whose one end is arranged on a base and the other end is connected to a hand for supporting a substrate, a linear guide for guiding a rectilinear movement of the hand, and a belt driving mechanism for moving the hand along a guide rail of the linear guide. The substrate transfer apparatus having such a configuration supports a load acting on the hand by the multijoint arm and ensures rectilinear transfer performance of the hand by the linear guide. Therefore, since a special mechanism for passing the substrate through a dead point is not required, the configuration is prevented from becoming complicated. Furthermore, since the load does not directly act on the linear guide, high transfer accuracy can be obtained.

5 Claims, 7 Drawing Sheets

SUBSTRATE TRANSFER APPARATUS

FIELD

The present disclosure relates to a substrate transfer apparatus for transferring a substrate to be processed, such as a semiconductor substrate and a glass substrate.

BACKGROUND

In recent years, there are known multi-chamber apparatuses in which various substrate treatments can be consistently carried out under vacuum by arranging a plurality of process chambers around a transfer chamber so as to center on the transfer chamber and connecting them via gate valves, as substrate processing apparatuses for processing substrates to be processed, such as semiconductor wafers and glass substrates for liquid crystal display devices under vacuum. The multi-chamber type vacuum processing apparatus of this type is provided with a substrate transfer apparatus for automatically carrying in/out the substrates from the transfer chamber to each of the process chambers.

As the substrate transfer apparatus, a parallel link type apparatus as shown in FIG. 7 is known (see Patent Document 1 below), for example. The parallel link type substrate transfer apparatus 5 shown in the figure includes a pair of rotating shafts 1, 2 to at least one of which a driving source is connected, first arms 11, 12, one end of each of which is connected to the rotating shafts 1, 2, a pair of second arms 21, 22, one end of each of which is rotatably connected to the corresponding one of the other ends of the first arms 11, 12, and a hand 4 rotatably coupled to each of the other ends of the second arms 21, 22.

The first arms 11, 12 and the second arms 21, 22 have the same arm length and form a parallel link mechanism. Therefore, by rotating the rotating shafts 1, 2 in opposite directions, angles 8 respectively formed by the first arms 11, 12 and the second arms 21, 22 change, and the hand 4 is moved in upward and downward directions in the figure. Accordingly, it becomes possible to transfer a substrate W on the hand 4 to any position.

Patent Document 1: Japanese Patent Application Laid-open No. Hei 9-283588
Patent Document 2: Japanese Patent Application Laid-open No. 2004-228370

SUMMARY

Problems to be Solved by the Invention

In the parallel link type substrate transfer apparatus of the past shown in FIG. 7, the substrate W needs to pass through a position where the first arms 11, 12 and the second arms 21, 22 become parallel to each other ($\theta=0°$) when the substrate W is transferred from the front to the back, for example. This position corresponds to the dead point of the parallel link mechanism, and interferes with a smooth transfer of the substrate W. Therefore, the substrate transfer apparatus 5 shown in the figure includes a dead point escaping mechanism which is composed of a first pulley 6 concentrically fixed to the rotating shaft 2, a second pulley 7 concentrically fixed to a connecting portion between the first arm 11 and the second arm 21, and a belt 8 spanned between the first pulley 6 and the second pulley 7. With this configuration, it becomes possible to stably transfer the substrate W by directly transmitting a rotational force of the rotating shaft 2 to the second arm 21 via the belt 8 to smoothly pass the substrate W through the dead point position of the link.

However, in the parallel link type substrate transfer apparatus, there is a problem that because the dead point escaping mechanism as described above is required for smoothly passing the substrate through the dead point of the link mechanism, the configuration of the apparatus becomes complicated. Further, there is also a problem that the parallel link type substrate transfer apparatus does not always have high capability of linearly transferring substrates, and thus it is difficult to obtain high feeding accuracy.

In contrast, a linear motion type substrate transfer apparatus in which a hand is moved along a linear guide is known (see Patent Document 2 above). There is an advantage that the linear motion type substrate transfer apparatus can make the configuration simple because it has no dead point as in the parallel link type substrate transfer apparatus. Further, the linear motion type substrate transfer apparatus is excellent in capability of linearly transferring substrates, and thus high feeding accuracy can easily be obtained.

However, in the linear motion type substrate transfer apparatus, self-weights of the substrate to be transferred and the hand directly act on the linear guide. The linear guide has a problem in that due to low load characteristics, when a high load acts on the linear guide, substrate transfer accuracy deteriorates and high feeding accuracy cannot be obtained, which makes it impossible to cope with an increase in a size of the substrate that is expected to make a further progress in the future.

The present invention has been made in view of the above-mentioned problems, and it is therefore an object of the present invention to provide a substrate transfer apparatus which can perform stable and highly accurate transfer without making the configuration complicated.

Means for Solving the Problems

To solve the above-mentioned problems, according to the present invention, provided is a substrate transfer apparatus including a multijoint arm whose one end is arranged on a base and the other end is connected to a hand for supporting a substrate, a linear guide configured to guide a rectilinear movement of the hand, and a belt driving mechanism configured to move the hand along a guide rail of the linear guide.

In the substrate transfer apparatus according to the present invention that has the above mentioned configuration, the multijoint arm does not have its own driving source, and expands and contracts by driving of the belt driving mechanism connected to the hand to linearly move the hand along the guide rail of the linear guide. The substrate transfer apparatus having such a configuration supports a load that acts on the hand by the multijoint arm, and ensures the linear transfer capability of the hand by the linear guide. Therefore, since a special mechanism for passing the substrate through the dead point is not required, the configuration is prevented from becoming complicated. Furthermore, since the load does not directly act on the linear guide, high transfer accuracy and durability can be obtained at the same time.

The belt driving mechanism according to the present invention includes a driving pulley connected to a driving shaft, driven pulleys, a belt member spanned between the driving pulley and the driven pulleys, a connecting member that connects the belt member and the hand, and configured to move along the guide rail of the linear guide, and a frame member arranged on the base and supports the driving pulley and the driven pulleys. The belt member converts a rotational motion of the driving pulley into a linear motion of the hand to achieve highly accurate feed control.

Further, the driving pulley and the driven pulleys are provided in a couple, and auxiliary pulleys that adjusts a tension of the belt member are respectively provided between the driven pulleys and the driving pulleys. With this configuration, it becomes possible to maintain an appropriate tension of the belt member and surely transmit a rotational driving force of the driving pulley to the belt member.

It should be noted that when a sufficient friction force in a joint surface between the driving pulley and the belt member is maintained, the rotational angle of the driving shaft accurately coincides with the travel distance of the hand without a backlash. However, if a displacement from a desired position may be caused by a slippage due to an external force accidentally applied thereto, a plurality of engaging protrusions may be provided on a circumferential surface of the driving pulley and engaging holes that engage with the plurality of engaging protrusions may be formed on a circumferential surface of the belt member, in order to avoid such a case.

Further, by making the driving shaft detachable from the driving pulley, it becomes possible to enhance maintainability of the belt driving mechanism. With this structure, a remarkable effect can be obtained especially in the case where the present invention is applied to substrate transfer within a vacuum chamber.

It should be noted that the configuration of the multijoint arm is not specifically limited. For example, a configuration in which the multijoint arm includes a pair of first arms, one end of each of which is rotatably supported by the base, and a pair of second arms, one end of each of which is rotatably coupled to a corresponding one of the other ends of the pair of first arms, and the hand is rotatably coupled to each of the other ends of the pair of second arms can be employed. The length of each of the first arms and second arms may be the same or may be different.

Effect of the Invention

As described above, according to the substrate transfer apparatus of the present invention, high transfer accuracy of the substrate can be obtained without making the configuration complicated.

DETAILED DESCRIPTION

Hereinafter, an embodiment of the present invention will be described with reference to the drawings. A substrate transfer apparatus of this embodiment is arranged in a vacuum transfer chamber of a multi chamber apparatus (not shown) having a plurality of vacuum processing chambers disposed around the vacuum transfer chamber, and configured to automatically transfer a substrate to be processed, such as a semiconductor wafer and a glass substrate, among the plurality of vacuum processing chambers including load/unload chambers.

Figure 1:
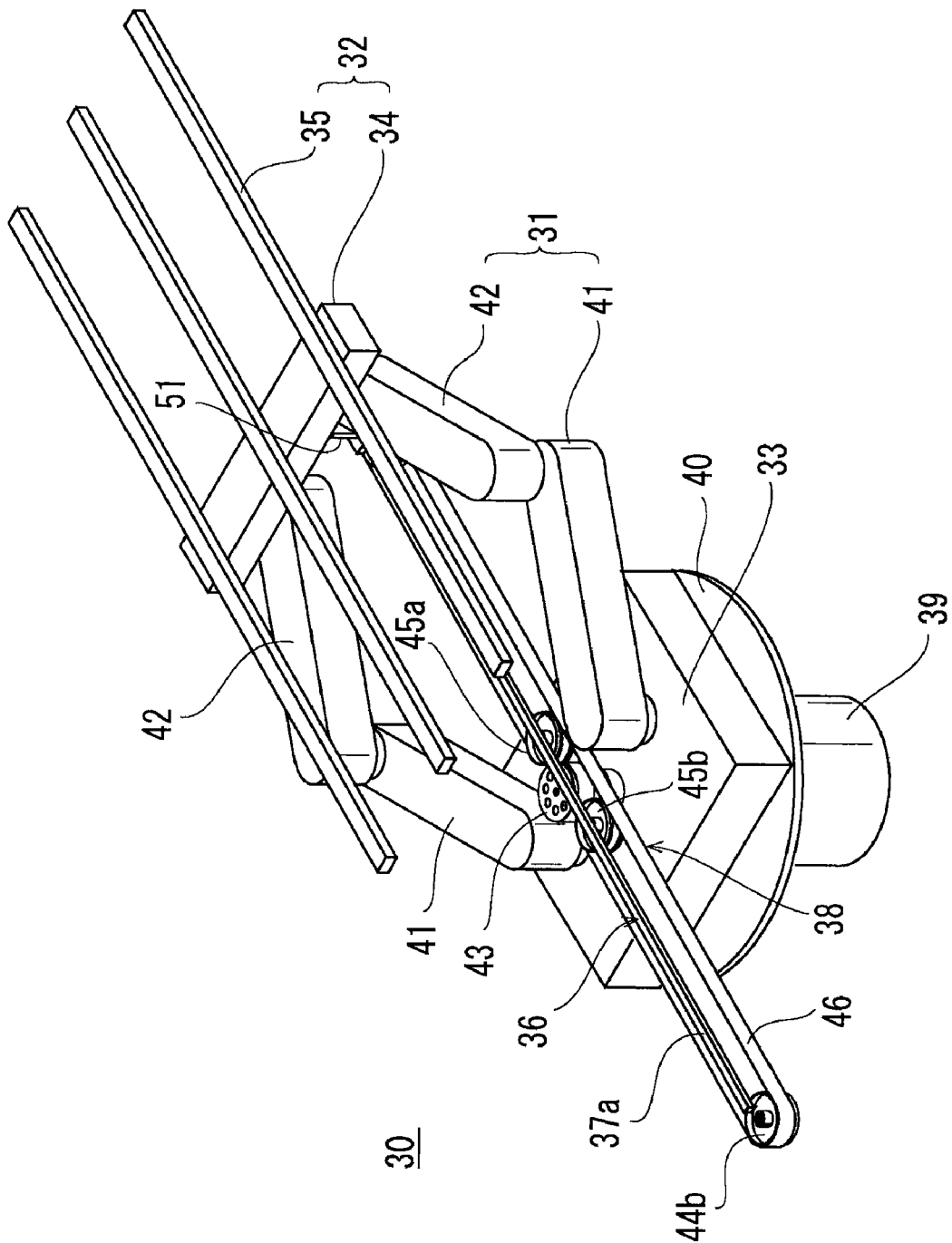
FIG. 1 is a perspective view schematically illustrating a configuration of a substrate transfer apparatus according to an embodiment of the present invention.

FIG. 1 is a perspective view showing the configuration of a substrate transfer robot 30 according to an embodiment of the present invention. This substrate transfer robot 30 includes a multijoint arm 31 whose tip portion is coupled to a hand 32, and a belt driving mechanism 38 for linearly moving the hand 32. It should be noted that the configuration of the belt driving mechanism 38 is shown in a simplified way for easier comprehension.

In this embodiment, the multijoint arm 31 is configured in a parallel link form, which has a pair of first arms 41, 41, one end of each of which is rotatably supported by a base 33, and a pair of second arms 42, 42, one end of each of which is rotatably coupled to a corresponding one of the other ends of the pair of first arms 41, 41. The first arm 41 and the second arm 42 have the same arm length, but the length is not limited thereto and may be differed. The hand 32 is composed of a block portion 34 rotatably connected to each of the other ends of the pair of second arms 42, 42, and a plurality of fork portions 35 for supporting a substrate.

The base 33, on which the one end of the multijoint arm 31 configured as described above is arranged, is provided with the belt driving mechanism 38 for controlling the travel distance and travel direction of the hand 32, and a linear guide 36 for guiding a linear motion of the hand 32. The belt driving mechanism 38 linearly moves the hand 32 along a guide rail 37a of the linear guide 36. Hereinafter, a description of details of the belt driving mechanism 38 will be made with reference to FIGS. 2 to 5.

Figure 2:
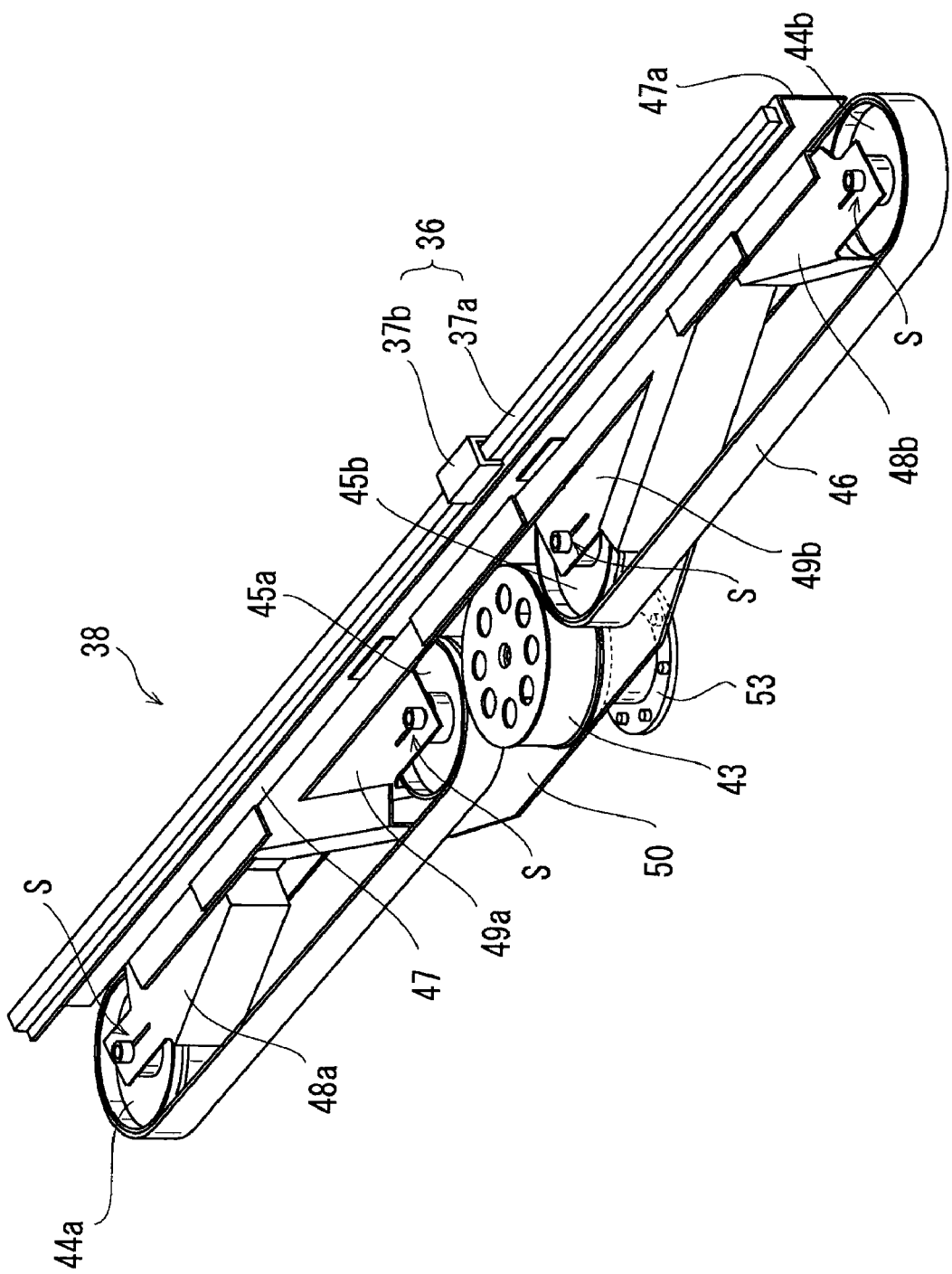
FIG. 2 is an overall perspective view of a belt driving mechanism constituting a substrate transfer apparatus according to the embodiment of the present invention.
Figure 3:
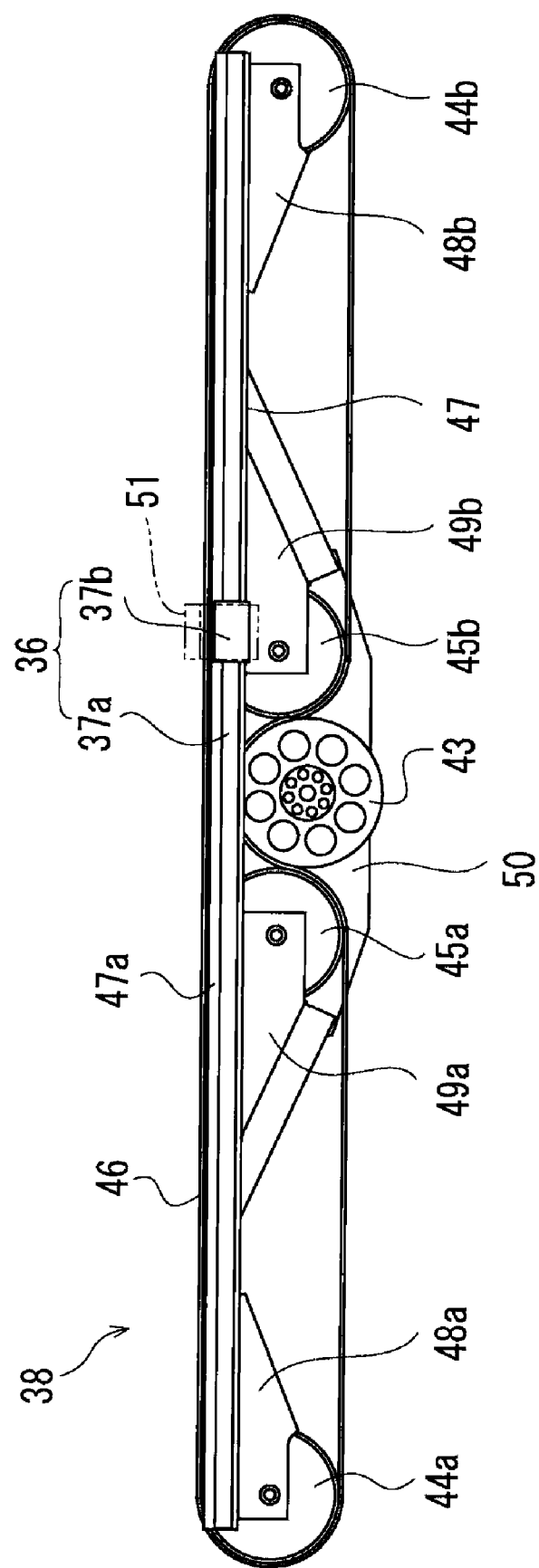
FIG. 3 is a plan view of the belt driving mechanism shown in FIG. 2.

FIGS. 2 and 3 are a perspective view and a plan view showing a specific configuration example of the belt driving mechanism 38, respectively. The belt driving mechanism 38 includes a driving pulley 43 coupled to a driving shaft 55 (FIG. 6), driven pulleys 44a, 44b, and a belt member 46 spanned between the driving pulley 43 and the driven pulleys 44a, 44b. The driven pulleys 44a, 44b are provided in a pair, and the distance between them is appropriately set in accordance with the travel distance of the hand 32.

Auxiliary pulleys 45a, 45b for adjusting a tension of the belt member 46 are provided between each of the driven pulleys 44a, 44b and the driving pulley 43, thus enhancing an attachment force between the driving pulley 43 and the belt member 46.

Figure 4:
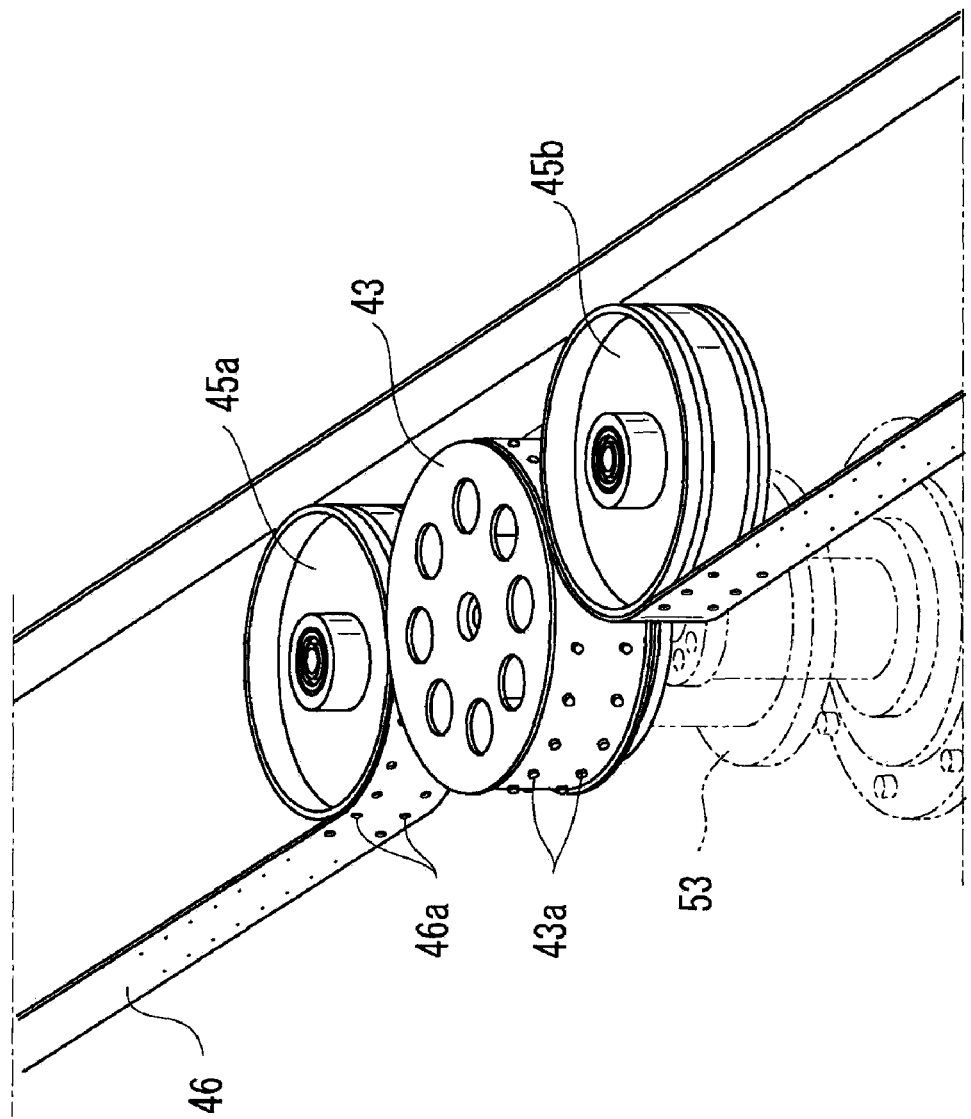
FIG. 4 is a perspective view of the belt driving mechanism shown in FIG. 2 in the vicinity of a driving pulley.

The belt driving mechanism 38 converts a rotational motion of the driving pulley 43 to a straight running motion of the belt member 46. In particular, as shown in FIG. 4, it is preferable that a plurality of engaging protrusions 43a are formed on a circumferential surface of the driving pulley 43, and engaging holes 46a that engage with the engaging protrusions 43a are provided on a belt surface of the belt member 46. Thus, a slippage between the driving pulley 43 and the belt member 46 can be prevented, and the rotational force of the driving pulley 43 can surely be transmitted to the belt member 46. It should be noted that an illustration of a frame member 47 is omitted in FIG. 4.

Axial center portions of the driven pulleys 44a, 44b and the auxiliary pulleys 45a, 45b are collinearly aligned. The belt member 46 is composed of a metal belt formed of stainless steel and the like and is spanned between the pulleys within a horizontal plane being a substrate transfer surface. Thus, the configuration of the belt driving mechanism 38 is reduced in size. Further, the belt driving mechanism 38 can easily be provided in a vacuum transfer chamber.

The driving pulley 43, the driven pulleys 44a, 44b, and the auxiliary pulleys 45a, 45b are rotatably supported by the frame member 47. The frame member 47 includes bracket portions 48a, 48b for supporting the driven pulleys 44a, 44b, bracket portions 49a, 49b for supporting the auxiliary pulleys 45a, 45b, and a base portion 50 for supporting the driving pulley 43. It should be noted that each of the bracket portions 48a, 48b, 49a, 49b is provided with an adjusting mechanism portion S for adjusting the shaft supporting positions of the driven pulleys 44a, 44b and auxiliary pulleys 45a, 45b.

The guide rail 37a of the linear guide 36 is positioned on an inverse-L-shaped linear angled portion 47a of the frame member 47. The guide rail 37a is arranged parallel to the belt surface of the belt member 46, which linearly extends from one driven pulley 44a to the other driven reel 44b. It should be noted that the guide rail 37a may of course be configured by combining a plurality of rails.

Figure 5:
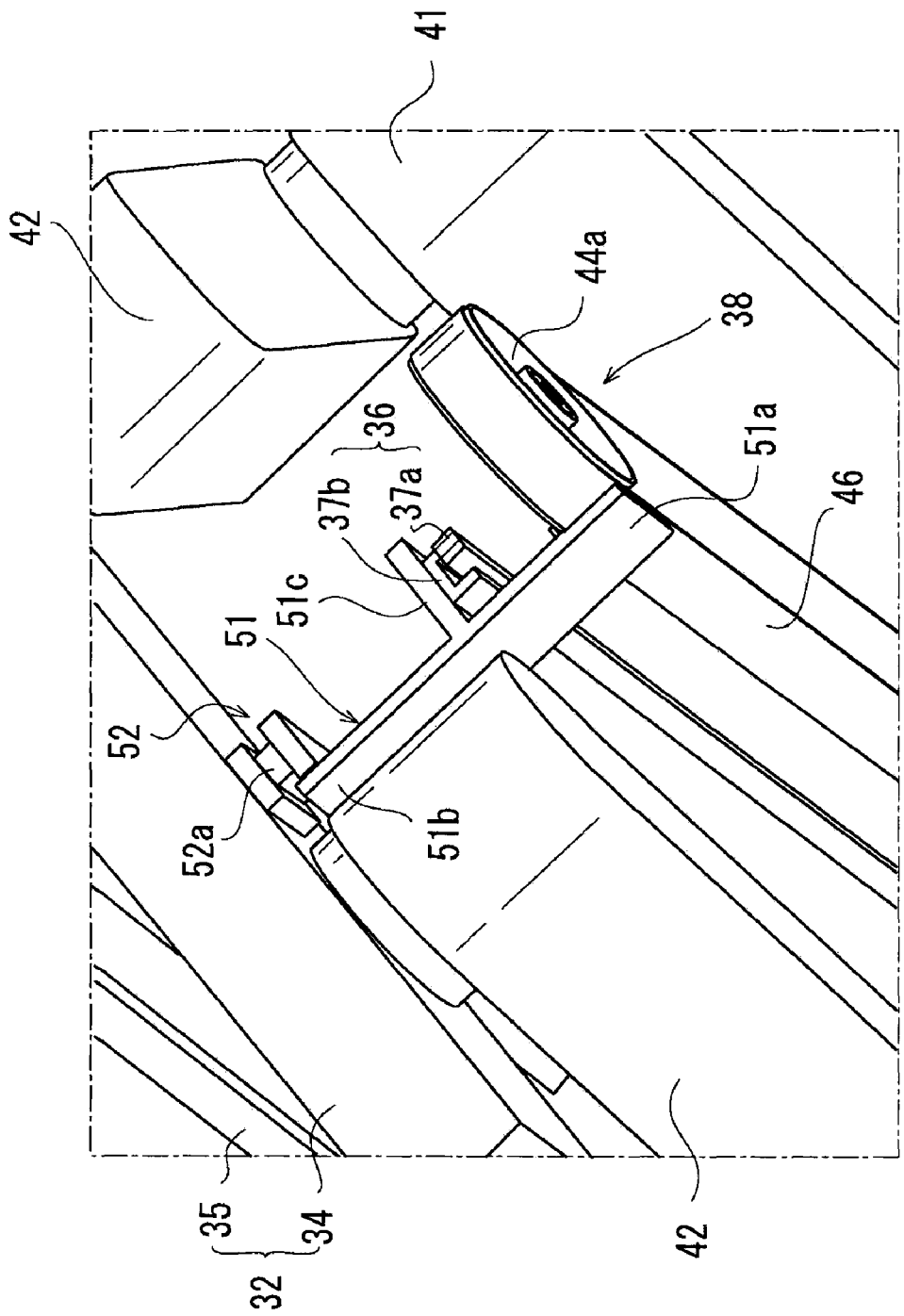
FIG. 5 is a perspective view of the belt driving mechanism shown in FIG. 2 at a position immediately below a hand.

On the other hand, a slider 37b of the linear guide 36 that fits with the guide rail 37a is connected to the hand 32 and the belt member 46 via the connecting member 51 as shown in FIG. 5. Here, FIG. 5 is a perspective view showing the configuration of the belt driving mechanism 38 at a position immediately below the hand 32, and an illustration of the frame member 47 is omitted for easier comprehension.

A lower end portion 51a of the connecting member 51 is integrally fixed to the belt member 46, and an upper end portion 51b is fixed to the block portion 34 of the hand 32 via a load buffering mechanism 52 to be described later. An arm portion 51c connected to the slider 37b of the linear guide 36 is formed at substantially the center portion of the connecting member 51 so as to protrude therefrom. With the above-described configuration, when the belt member 46 travels, the hand 32 is linearly moved along the guide rail 37a of the linear guide 36 via the connecting member 51.

The load buffering mechanism 52 is provided for the purpose of preventing a load in the vertical direction that acts on the hand 32 from acting directly on the linear guide 36. In the substrate transfer apparatus 30 of this embodiment, a load in the vertical direction that acts on the hand 32 is supported by the arms 41, 42 of the multijoint arm 31, so the load does not directly act on the linear guide 36. However, because a deflection may be caused in the multijoint arm 31, for example, the above-described load buffering mechanism 52 is provided between the hand 32 and the connecting member 51 in this embodiment to prevent the load from directly acting on the guide rail 36. The load buffering mechanism 52 can be composed of, for example, a block body incorporating an impact absorber 52a such as an elastic material including rubber and a spring pin.

The belt driving mechanism 38 configured as described above is arranged on the base 33 via a cylindrical fix portion 53 coaxially positioned immediately below the driving pulley 43 and integrally fixed to the base portion 50. The base 33 for supporting the multijoint arm 31 and the belt driving mechanism 38 is arranged on a rotating table 40 mounted to a rotating mechanism portion 39 (FIG. 1). The rotating mechanism portion 38 rotatably supports the base 33 with respect to a bottom wall surface of the vacuum transfer chamber (not shown). The driving pulley 43 of the belt driving mechanism 38 is aligned at a rotational axial center potion of the base 33.

Figure 6:
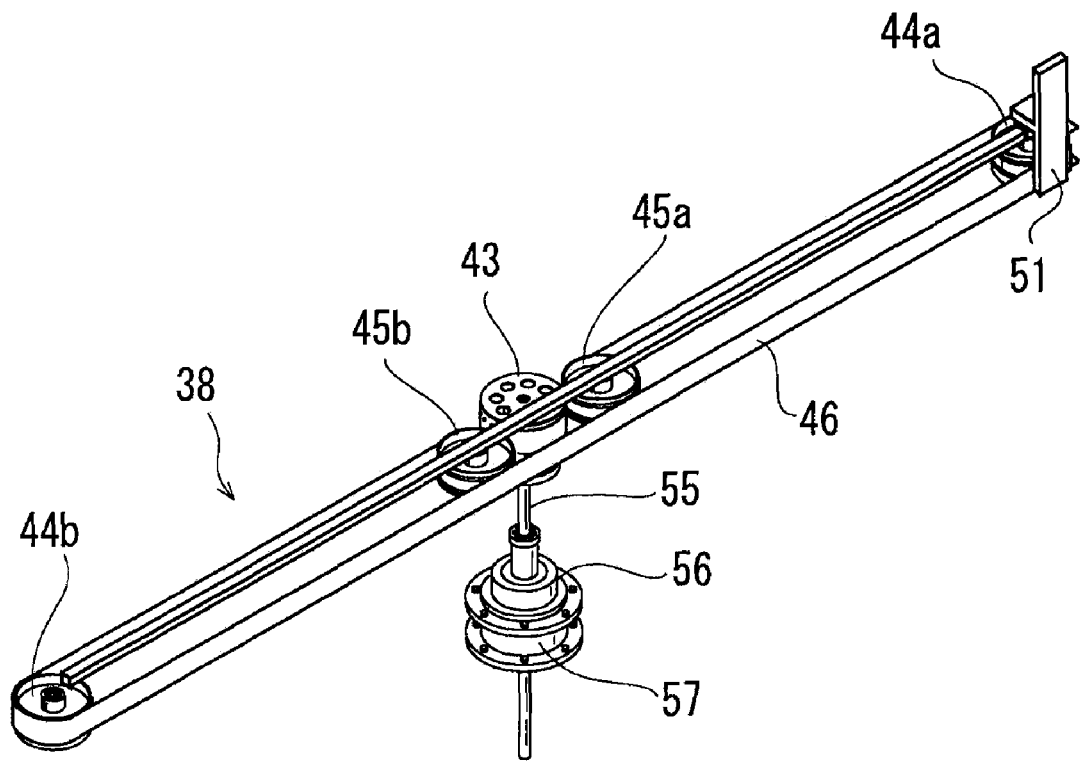
FIG. 6 is a perspective view showing a relationship between the belt driving mechanism shown in FIG. 2 and a driving shaft.
Figure 7:
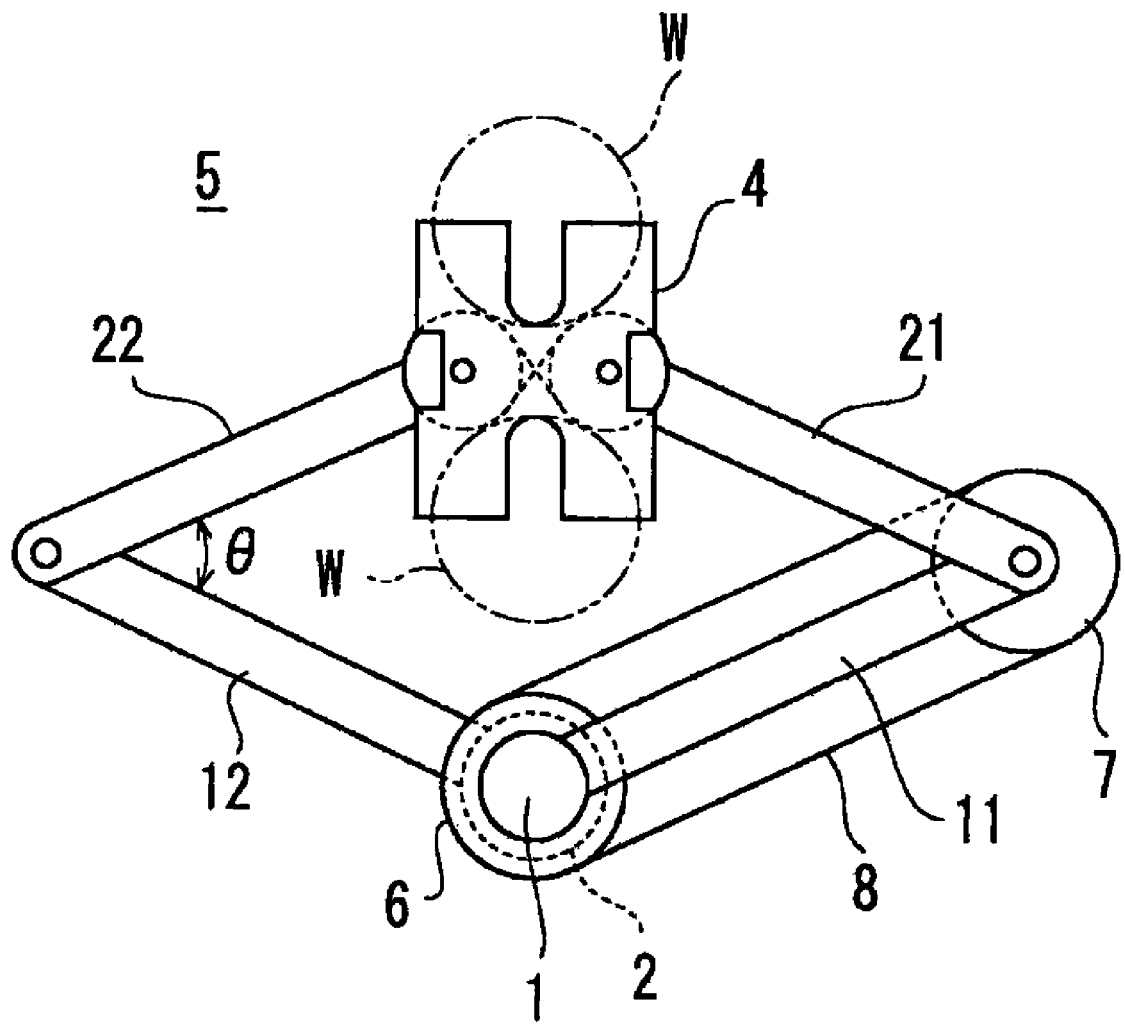
FIG. 7 is a plan view showing a configuration of a substrate transfer apparatus of the related art.

The driving shaft 55 for rotating the driving pulley 43 is configured to be detachable from the driving pulley 43, as shown in FIG. 6. The driving shaft 55 includes a rotating vacuum sealing mechanism 57 and is inserted from an atmospheric side and coupled to an axial center portion of the driving pulley 43 via the bottom wall of the vacuum transfer chamber (not shown). On an outer circumferential side of the driving shaft 55, a pivot shaft 56 for turning the base 33 is arranged concentrically with the driving shaft 55. The pivot shaft 55 is integrally coupled to the frame member 47 (fix portion 53) of the belt driving mechanism 38, and gives the frame 47 a rotational axial force to obtain a pivot action of the base 33.

In the substrate transfer apparatus 30 of this embodiment configured as described above, the driving pulley 43 is rotated by rotational driving of the driving shaft 55 so that the belt member 46 is moved. The hand 32 is linearly moved along the guide rail 37a of the linear guide 36 by traveling of the belt member 46, since the hand 32 is connected to the belt member 46 via the connecting member 51, and the connecting member 51 is fixed to the slider 37b of the linear guide 36. Thus, the travel distance of the hand 32 is controlled by the rotating amount of the driving pulley 43, and the travel direction of the hand 32 is controlled by the rotating direction of the driving pulley 43.

At this time, each of the arms 41, 42 of the multijoint arm 31 does not have its own driving source, and expands and contracts in accordance with the running direction and running distance of the belt member 46. Therefore, the expand and contract action of the multijoint arm 31 can be carried out smoothly even at a dead point position of the parallel link mechanism where an angle formed by the first arm 41 and the second arm 42 becomes 0°. Thus, stable straight transfer capability of the hand 32 can be obtained.

Further, in the substrate transfer apparatus 30 of this embodiment, since the load in the vertical direction acting on the hand 32 is supported by the multijoint arm 31, the load is prevented from directly acting on the linear guide 36, whereby degradation in travel accuracy of the hand 32 by the linear guide 36 can be prevented. Accordingly, high feed accuracy or transfer accuracy and durability of the hand 32 can be obtained at the same time.

Further, in the substrate transfer apparatus 30 of this embodiment, because each pulley and the belt member configuring the belt driving mechanism 38 are modularized on the frame member 47, and the driving shaft 55 of the belt driving mechanism 38 is configured to be detachable from the driving pulley 43, it is possible to facilitate removing of the belt driving mechanism 38 and improve maintainability. In addition, since the pivot shaft 56 of the base 33 is arranged concentrically with the driving shaft 55, the configuration of the driving source of the substrate transfer apparatus 30 can be reduced in size and simplified.

The embodiment of the present invention has been described above, but the present invention is of course not limited thereto and various modifications can be made based on the technical idea of the present invention.

For example, in the embodiment described above, the belt member 46 configuring the belt driving mechanism 38 is made of metal, but the material is not limited thereto and other materials such as a resin can also be used.

In addition, in order to enhance an attachment force between the driving pulley 43 and the belt member 46, the driving pulley 43 may be made of a permanent magnet, and the belt member 46 may be made of a ferromagnetic material. Alternatively, a pinching force of the belt member 46 may be enhanced by magnetically coupling the driving pulley 43 and the auxiliary pulleys 45a, 45b.

Further, the multijoint arm 31 is not limited to the parallel link type described above. In addition, the substrate transfer system can be applied not only to substrate transfer within a vacuum atmosphere, but also to substrate transfer in an air atmosphere.

What is claimed is:

1. A substrate transfer apparatus, comprising:
    a multijoint arm whose one end is arranged on a base and the other end is connected to a hand for supporting a substrate;
    a linear guide configured to guide a rectilinear movement of the hand; and
    a belt driving mechanism configured to move the hand along a guide rail of the linear guide;
    said belt driving mechanism comprising:
        a driving pulley connected to a driving shaft,
        driven pulleys,
        a belt member spanned between the driving pulley and the driven pulleys,
        a connecting member that connects the belt member and the hand, said connecting member being integrally fixed to a slider of the linear guide, and
        a frame member arranged on the base and supports the driving pulley and the driven pulleys; and
            wherein the driven pulleys are provided in a couple with the driving pulley interposed therebetween;
            each of the driven pulleys and the driving pulley have an auxiliary pulley that adjusts the tension of the belt member provided therebetween; and
            the belt member is spanned between the driving pulley and the driven pulleys within a substantially horizontal plane.

2. The substrate transfer apparatus according to claim 1, characterized in that:
    the driving pulley is provided with a plurality of engaging protrusions on a circumferential surface thereof; and
    the belt member is formed with a plurality of engaging holes that engage with the plurality of engaging protrusions.

3. The substrate transfer apparatus according to claim 1, characterized in that the driving shaft is detachable from the driving pulley.

4. The substrate transfer apparatus according to claim 1, characterized in that a pivot shaft that turns the base is arranged concentrically with the driving shaft.

5. The substrate transfer apparatus according to claim 1, characterized in that:
    the multijoint arm includes a pair of first arms, one end of each of which is rotatably supported by the base, and a pair of second arms, one end of each of which is rotatably coupled to a corresponding one of the other ends of the pair of first arms; and
    the hand is rotatably coupled to each of the other ends of the pair of second arms.

* * * * *